(12) United States Patent
Lee et al.

(10) Patent No.: US 8,268,690 B2
(45) Date of Patent: Sep. 18, 2012

(54) METHODS OF FORMING SEMICONDUCTOR DEVICES HAVING RECESSED CHANNELS

(75) Inventors: Joo-Young Lee, Gyeonggi-do (KR); Dong-Gun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 12/770,942

(22) Filed: Apr. 30, 2010

(65) Prior Publication Data

US 2010/0285644 A1    Nov. 11, 2010

(30) Foreign Application Priority Data

May 8, 2009    (KR) .................. 10-2009-0040086

(51) Int. Cl.
*H01L 21/336* (2006.01)
*H01L 21/3205* (2006.01)

(52) U.S. Cl. ....................... 438/286; 438/589

(58) Field of Classification Search .......... None
See application file for complete search history.

(56) References Cited

U.S. PATENT DOCUMENTS

| | | | |
|---|---|---|---|
| 7,164,170 B2 * | 1/2007 | Kim .......................... | 257/330 |
| 7,211,482 B2 * | 5/2007 | Kim et al. ................. | 438/238 |
| 7,378,312 B2 * | 5/2008 | Kim .......................... | 438/243 |
| 7,615,429 B2 * | 11/2009 | Kim et al. ................. | 438/197 |
| 2007/0210357 A1 * | 9/2007 | Kim .......................... | 257/288 |

FOREIGN PATENT DOCUMENTS

| | | | |
|---|---|---|---|
| KR | 10-0500473 | | 7/2005 |
| KR | 1020040101175 A | * | 6/2006 |
| KR | 1020060062358 A | | 6/2006 |
| KR | 1020070019451 A | | 2/2007 |

* cited by examiner

*Primary Examiner* — Scott B Geyer
(74) *Attorney, Agent, or Firm* — Myers Bigel Sibley & Sajovec

(57) ABSTRACT

A semiconductor device includes a substrate, a gate insulation layer, a gate structure, a gate spacer, and first and second impurity regions. The substrate has an active region defined by an isolation layer. The active region has a gate trench thereon. The gate insulation layer is formed on an inner wall of the gate trench. The gate structure is formed on the gate insulation layer to fill the gate trench. The gate structure has a width smaller than that of the gate trench, and has a recess at a first portion thereof. The gate spacer is formed on sidewalls of the gate structure. The first and second impurity regions are formed at upper portions of the active region adjacent to the gate structure. The first impurity region is closer to the recess than the second impurity region. Related methods are also provided.

7 Claims, 11 Drawing Sheets

METHODS OF FORMING SEMICONDUCTOR DEVICES HAVING RECESSED CHANNELS

CLAIM OF PRIORITY

This application claims priority to Korean Patent Application No. 2009-40086, filed May 8, 2009, the contents of which are hereby incorporated herein by reference as if set forth in its entirety.

FIELD

The present invention relates to semiconductor devices and methods of manufacturing the same and, more particularly, to semiconductor devices having recessed channel transistors and methods of manufacturing the same.

BACKGROUND

As semiconductor devices have been highly integrated, the dimensions of the semiconductor devices on a substrate have been reduced. For example, the area of a gate structure of a transistor has been reduced, which may result in short channel length around the gate structure. Thus, methods of increasing the channel length without increasing the size of the device have been studied.

As a result, methods of forming a recessed channel transistor in which a lower portion of a gate structure may be buried in a substrate have been introduced. The above gate structure may be called a recessed gate structure. The recessed channel transistor may have increased channel length, however, an overlapping area of the recessed gate structure with a drain region may increase, so that, the gate induced drain leakage (GIDL) of the recessed channel transistor may be increased. Thus, dynamic random access memory (DRAM) devices having the recessed channel transistor may have poor refresh characteristics.

SUMMARY

Some embodiments discussed herein provide a semiconductor device including a substrate having an active region defined by an isolation layer, the active region having a gate trench thereon; a gate insulation layer on an inner wall of the gate trench; a gate structure on the gate insulation layer, the gate structure filling the gate trench, having a width smaller than a width of the gate trench, and having a recess at a first portion thereof; a gate spacer on sidewalls of the gate structure; and first and second impurity regions at upper portions of the active region adjacent to the gate structure, the first impurity region being closer to the recess than the second impurity region.

In further embodiments, the gate spacer comprises a first spacer and a second spacer, the first spacer contacting the recess. The first spacer may have a larger height than a height of the second spacer.

In still further embodiments, the gate trench may extend in a first direction and may be further formed on the isolation layer. The gate structure may have a reduced width near the recess in a second direction perpendicular to the first direction.

In some embodiments, the gate structure may have a protrusion at a second portion thereof, the second impurity region being closer to the protrusion than the first impurity region. The gate spacer may have a first spacer and a second spacer, the first spacer contacting the recess, and the second spacer contacting the protrusion.

In further embodiments, a capacitor may be provided that is electrically connected to the first impurity region.

Still further embodiments of the present invention provide methods of forming a semiconductor device including forming an isolation layer on a substrate, the isolation layer defining an active region; forming a gate trench at an upper portion of the active region of the substrate; forming a gate insulation layer on an inner wall of the gate trench; forming a gate structure on the gate insulation layer to fill the gate trench, the gate structure having a width smaller than a width of the gate trench and having a recess at a first portion thereof; forming a gate spacer on sidewalls of the gate structure; and implanting impurities into upper portions of the active region to form first and second impurity regions adjacent to the gate structure, the first impurity region being closer to the recess than the second impurity region.

In some embodiments, forming the gate spacer may include forming first and second spacers, the first spacer contacting the recess. The first spacer may have a larger height than a height of the second spacer.

In further embodiments, the gate trench may be formed to extend in a first direction and be further formed on the isolation layer. The gate trench may be formed to have a reduced width near the recess in a second direction perpendicular to the first direction.

In still further embodiments, forming the gate structure may include forming the gate structure to have a protrusion at a second portion thereof, the second impurity region being closer to the protrusion than the first impurity region. Forming the gate spacer includes forming first and second spacers, the first spacer contacting the recess, and the second spacer contacting the protrusion.

In some embodiments, a capacitor may be formed that is electrically connected to the first impurity region.

Accordingly, semiconductor devices in accordance with some embodiments may have a gate structure having a width smaller than that of a gate trench, and having a recess adjacent to a first impurity region which may serve as a capacitor contact region. Thus, the semiconductor device may have a reduced GIDL and a relatively large area of the capacitor contact region because of the recess.

DETAILED DESCRIPTION OF THE EMBODIMENTS

Figure 1:
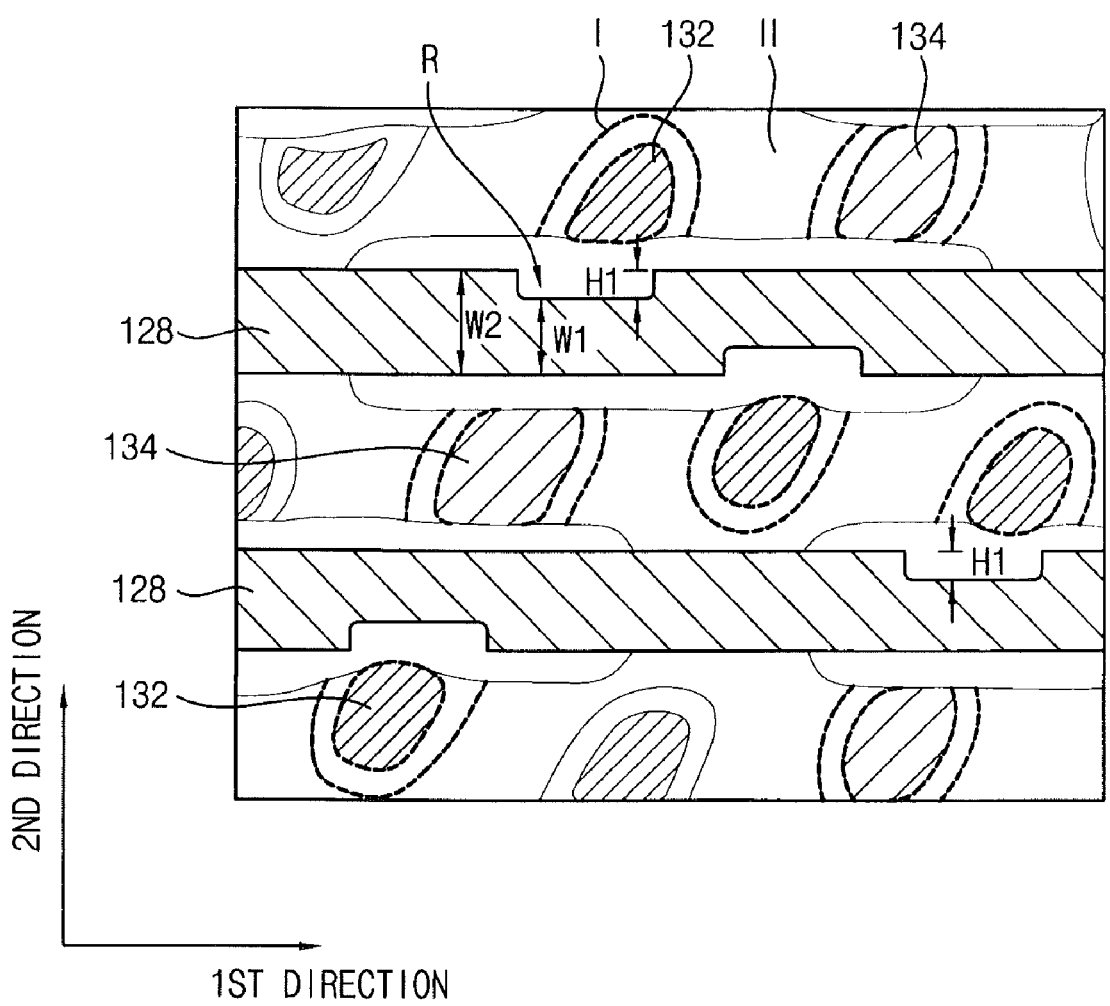
FIG. 1 is a top view illustrating a semiconductor device having a recessed channel transistor in accordance with some embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third and the like. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
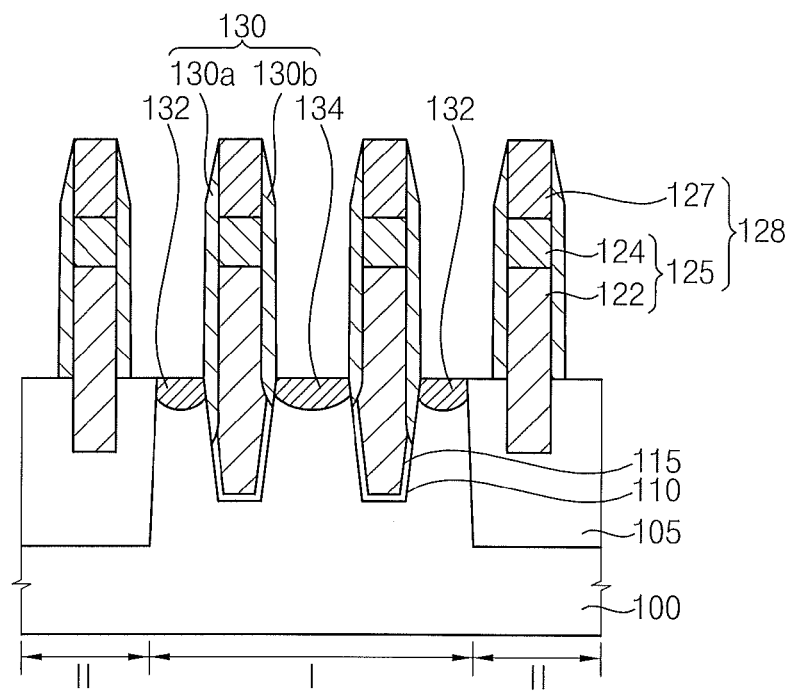
FIG. 2 is a cross-section of the semiconductor device in FIG. 1.

FIG. 1 is a top view illustrating a semiconductor device having a recessed channel transistor in accordance with some embodiments and FIG. 2 is a cross-section of the semiconductor device in FIG. 1. Referring first to FIGS. 1 and 2, the semiconductor device may include an active region I, a gate insulation layer 115, a gate structure 128, a gate spacer 130, a first impurity region 132 and a second impurity region 134.

The active region I of a substrate 100 may be defined by an isolation layer 105 on the substrate 100. That is, a region in which the isolation layer 105 is not formed may be called the active region I, and a region in which the isolation layer 105 is formed may be called a field region II. In some embodiments, a plurality of active regions I each having an island shape may be formed in the substrate 100. The substrate 100 may include a semiconductor substrate, such as a silicon substrate, a germanium substrate, a silicon-germanium substrate, a silicon-on-insulator (SOI) substrate, a germanium-on-insulator (GOI) substrate, and the like. The isolation layer 105 may include an oxide, such as silicon oxide.

A gate trench 110 may be formed at an upper portion of the active region I of the substrate 100. In some embodiments, the gate trench 110 may extend in a first direction, and thus the gate trench 110 may be also formed at an upper portion of the isolation layer 105. A first portion of the gate trench 110 in the active region I may have a depth larger than that of a second portion of the gate trench 110 in the field region II. The gate trench 110 may have a planar bottom or a rounded bottom.

The gate insulation layer 115 may be formed on an inner wall, i.e., on a bottom and a sidewall of the gate trench 110. The gate insulation layer 115 may include an oxide, such as silicon oxide. In some embodiments, the gate insulation layer 115 may not be formed on the second portion of the gate trench 110, i.e., in the field region II. In some embodiments, the gate insulation layer 115 may have a uniform thickness on the inner wall of the gate trench 110.

The gate structure 128 may be formed on the gate insulation layer 115 and may fill the gate trench 110. In the field region II, the gate structure 128 filling the gate trench 110 may not be formed on the gate insulation layer 115, but directly on the inner wall of the gate trench 110. The gate structure 128 may protrude from a top surface of the substrate 100. In some embodiments, the gate structure 128 may have a width smaller than that of the gate trench 110. In some embodiments, the gate structure 128 may have a recess R at a portion adjacent to the first impurity region 132, so that the gate structure 128 may have a reduced width by a first width difference H1, in a second direction perpendicular to the first direction. That is, the gate structure 128 may have a first width W1 near the recess R, and a second width W2 at other portions thereof, wherein the first width difference H1 is the difference between the first width W1 and the second width W2. At the recess R, the sidewall of the gate trench 110 may not be covered by the gate insulation layer 115 or by the gate structure 128 thereon. The gate structure 128 may include a gate electrode 125 and a gate mask 127. The gate electrode 125 may include polysilicon, a metal and/or a metal silicide. In some embodiments, the gate electrode 125 may include a polysilicon layer pattern 122 and a metal layer pattern 124. The metal layer pattern 124 may include the metal and/or the metal silicide. Alternatively, the gate electrode 125 may include a single layer having polysilicon, the metal or the metal silicide. The gate mask 127 may include a nitride, such as silicon nitride.

The gate spacer 130 may be formed on sidewalls of the gate structure 128. A lower portion of the gate spacer 130 may be formed on a portion of the sidewall of the gate trench 110 that is not covered by the gate insulation layer 115 and the gate structure 128, thereby filling a remaining portion of the gate trench 110 in the active region I. In some embodiments, the gate spacer 130 may have a first spacer 130a and a second spacer 130b. The first spacer 130a may contact the recess R of the gate structure 128, and the second spacer 130b may not contact the recess R thereof. Thus, the first spacer 130a may have a vertical length, particularly a vertical length thereof below the top surface of the substrate 100, larger than that of the second spacer 130b, because the first spacer 130a may fill the gate trench 110 more deeply than the second spacer 130b. The lower portion of the first spacer 130a may increase the electrical distance between the gate electrode 125 and the first impurity region 132, thereby reducing the gate induced drain leakage (GIDL) of the recessed channel transistor.

The first and second impurity regions 132 and 134 may serve as source/drain regions of the recessed channel transistor. Additionally, the first impurity region 132 may serve as a capacitor contact region electrically connected to a capacitor (not shown) via a capacitor contact plug (not shown), and the second impurity region 134 may serve as a bitline contact region electrically connected to a bitline (not shown) via a bitline contact plug (not shown). The first and second impurity region 132 and 134 may be at upper portions of the active region I adjacent to the gate structure 128. In some embodiments, the first impurity region 132 may be formed adjacent to the recess R of the gate structure 128. That is, the first impurity region 132 may be closer to the recess R than the second impurity region 134 is.

The recessed channel transistor in accordance with some embodiments may have a reduced GIDL and a relatively large area of the capacitor contact region because of the recess R.

Figure 3:
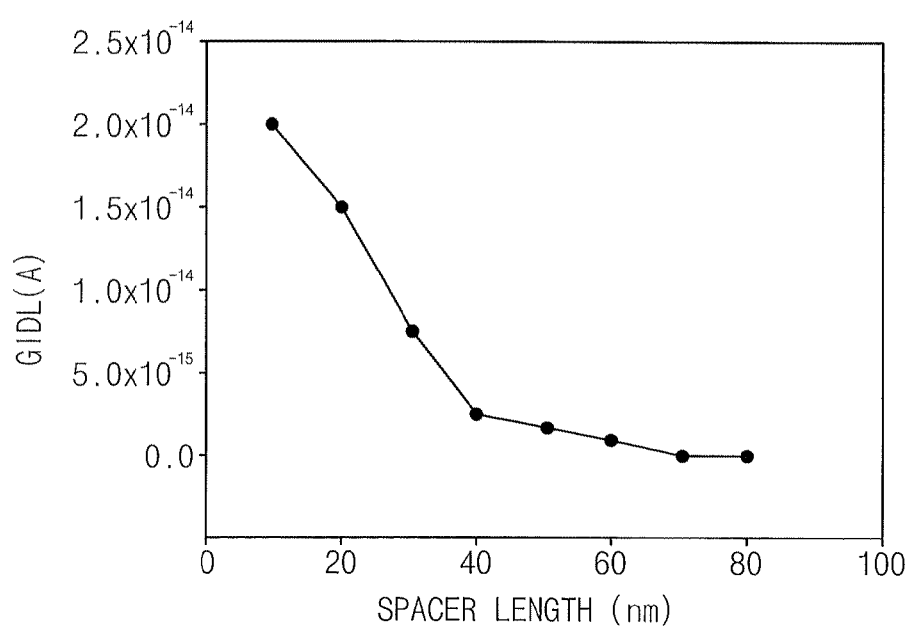
FIG. 3 is a graph illustrating a GIDL change of a recessed channel transistor according to a vertical length of a gate spacer below a top surface of a substrate, which is briefly represented as spacer length in the horizontal axis.

FIG. 3 is a graph illustrating the GIDL change of the recessed channel transistor according to the vertical length of the gate spacer 130 below the top surface of the substrate 100, which is briefly represented as spacer length in the horizontal axis. As illustrated in FIG. 3, the GIDL has a smaller value according as the vertical length of the gate spacer increases.

Figure 4:
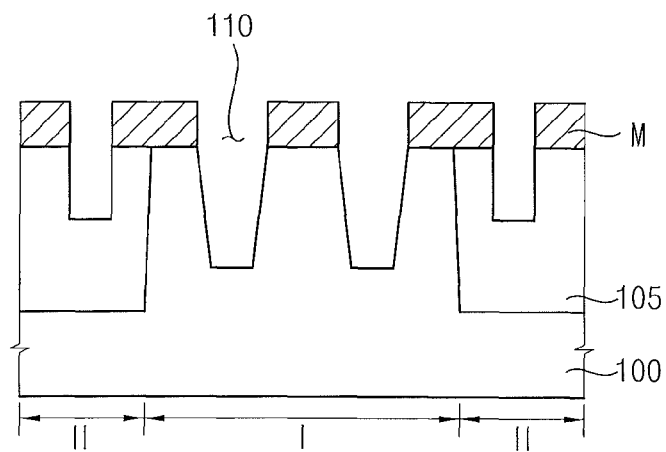
FIGS. 4 to 7 are cross-sections illustrating processing steps in the fabrication of a semiconductor device having a recessed channel transistor in accordance some embodiments.

FIGS. 4 to 7 are cross-sections illustrating processing steps in the fabrication of a semiconductor device having a recessed channel transistor in accordance with some embodiments. Referring first to FIG. 4, an isolation layer 105 may be formed on a substrate 100 to define an active region I and a field region II in the substrate 100. The substrate 100 may include a semiconductor substrate such as a silicon substrate, a germanium substrate, a silicon-germanium substrate, a silicon-on-insulator (SOI) substrate, a germanium-on-insulator (GOI) substrate, and the like. The isolation layer 105 may be formed using an oxide, such as silicon oxide. In some embodiments, the isolation layer 105 may be formed by a shallow trench isolation (STI) process.

A buffer layer (not shown) may be formed on the substrate 100 and the isolation layer 105. The buffer layer may be formed using an oxide, such as silicon oxide. The buffer layer may be formed by a chemical vapor deposition (CVD) process, a sub-atmospheric chemical vapor deposition (SACVD) process, a low pressure chemical vapor deposition (LPCVD) process, a plasma enhanced chemical vapor deposition (PECVD) process, and the like without departing from the scope of the present application.

Impurities may be implanted into the active region I of the substrate 100 by an ion implantation process to form a preliminary impurity region (not shown) in the active region I. A channel of the recessed channel transistor may be controlled by the preliminary impurity region. A mask M may be formed on the substrate 100 and the isolation layer 105. The mask may be formed using a nitride.

Upper portions of the substrate 100 and the isolation layer 105 may be removed using the mask M as an etching mask to form a gate trench 110. A first portion of the gate trench 110 in the active region I may have a depth larger than that of a second portion of the gate trench 110 in the field region II because of the etch rate difference between the substrate 100 and the isolation layer 105. In some embodiments, the gate trench 110 may be formed to have a depth of about 500 to about 1500 Å in a vertical direction, i.e., a direction substantially perpendicular to a top surface of the substrate 100. In an example embodiment, the gate trench 110 may be formed by a reactive ion etching (RIE) process to have a planar bottom. In another example embodiment, an anisotropic etching process and an isotropic etching process may be sequentially performed, so that the gate trench 110 may have a rounded bottom. In these embodiments, the gate trench 110 may have a vertical sidewall and the rounded bottom. After forming the gate trench 110, the mask M may be removed. A thermal oxidation process may be further performed on the substrate 100 to cure damages to the substrate 100 given in the etching process for forming the gate trench 110. In the thermal oxidation process, a sacrificial oxide layer (not shown) may be formed, and the sacrificial layer together with the remaining buffer layer may be removed by a wet etching process. The wet etching process may be performed using a solution including water and hydrogen fluoride.

Figure 5:
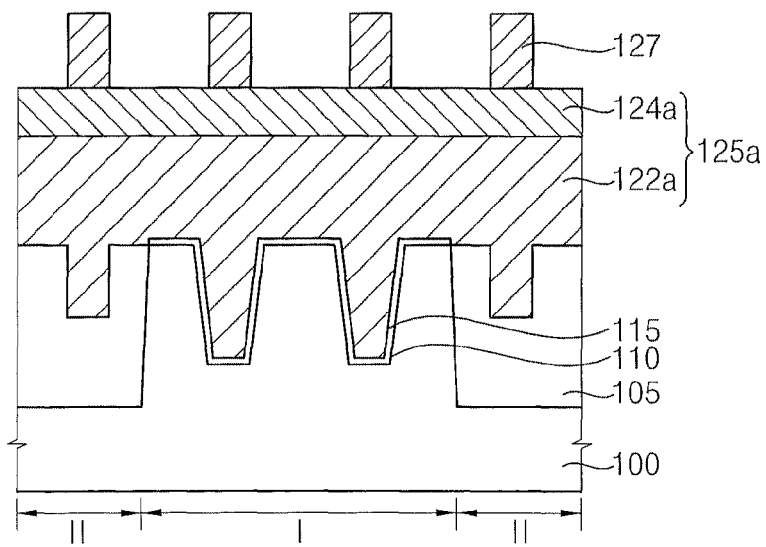

Referring now to FIG. 5, a gate insulation layer 115 may be formed on an inner wall of the gate trench 110 and a top surface of the substrate 100 in the active region I. The gate insulation layer 115 may be formed using silicon oxide or a metal oxide such as titanium oxide, zirconium oxide, hafnium oxide, and the like. The gate insulation layer 115 may be formed by a thermal oxidation process, a CVD process, a metal organic chemical vapor deposition (MOCVD) process or an atomic layer deposition (ALD) process without departing from the scope of the present application.

A gate conductive layer 125a may be formed on the gate insulation layer 115 and the isolation layer 104 to fill the gate trench 110. The gate conductive layer 125a may be formed using, for example, polysilicon doped with impurities or a metal. The gate conductive layer 125a may be formed by a sputtering process, a CVD process, an LPCVD process, a PECVD process, an ALD process, or a pulsed laser deposition (PLD) process without departing from the scope of the present application.

In some embodiments, the gate conductive layer 125a may be formed to have a single layer structure including doped polysilicon. In these embodiments, impurities may be doped into a polysilicon layer (not shown) by an ion implantation process, or a diffusion process. In other embodiments, the gate conductive layer 125a may be formed to have a multi-layered structure including polysilicon and a metal. That is, the gate conductive layer 125 may be formed to have a polysilicon layer 122a and a metal layer 124a sequentially stacked on the gate insulation layer 115 and the isolation layer 105. The metal layer 124a may be formed using tungsten (W), tungsten alloys, aluminum (Al), aluminum alloys, copper (Cu), and the like. The metal layer 124a may be formed by an inductively coupled plasma (ICP) process, an ion metal plasma (IMP) process, a sputtering process, or a CVD process. In an example embodiment, a metal silicide layer (not shown) may be further formed between the polysilicon layer 122a and the metal layer 124a.

A gate mask 127 may be formed on the gate conductive layer 125a. The gate mask 127 may be formed by forming a nitride layer on the gate conductive layer 125a and patterning the nitride layer. The nitride layer may be formed by a PECVD process or a LPCVD process. In some embodiments, the nitride layer may be formed using silane ($SiH_4$) gas and ammonia ($NH_3$) gas. The gate mask 127 may overlap the gate trench 110, and may have a width equal to or smaller than that of the gate trench 110.

Figure 6:
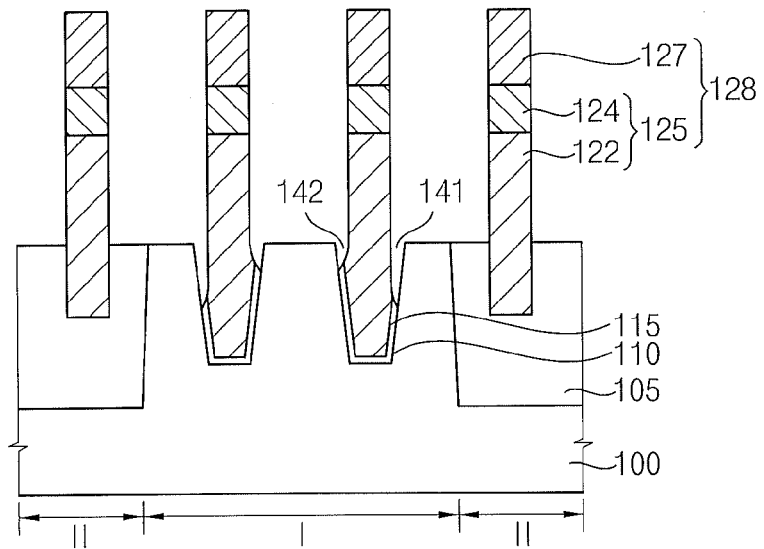

Referring to FIG. 6, the gate conductive layer 125a may be patterned using the gate mask 127 as an etching mask to form a gate electrode 125. In the etching process, a portion of the gate insulation layer 115 beneath the gate conductive layer 125a may be also etched to expose a portion of the sidewall of the gate trench 110. The gate electrode 125 together with the gate mask 127 may be called a gate structure 128. In some embodiments, the gate electrode 125 may have a polysilicon layer pattern 122 and a metal layer pattern 124 sequentially stacked on the gate insulation layer 115 or the isolation layer 105. The gate structure 128 may fill the gate trench 110. In the field region II, the gate structure 128 may sufficiently fill the gate trench. In the active region I, the gate structure 128 may have a width smaller than that of the gate trench 110, thereby partially filling the gate trench 110. In an example embodiment, the gate structure 128 may have a recess R (see FIG. 1) at a portion adjacent to a portion of the active region I at which a first impurity region 132 (see FIG. 7) is formed in a subsequent process, so that the gate structure 128 may have a reduced width by a first width difference H1 (see FIG. 1). At the recess R, the sidewall of the gate trench 110 may be covered neither by the gate insulation layer 115 nor by the gate structure 128 thereon. Thus, a first groove 141 may be formed in the gate trench 110 adjacent to the first portion of the gate structure 128. A second groove 142 having a smaller depth may be further formed in the gate trench 110 adjacent to the second portion of the gate structure 128.

Figure 7:
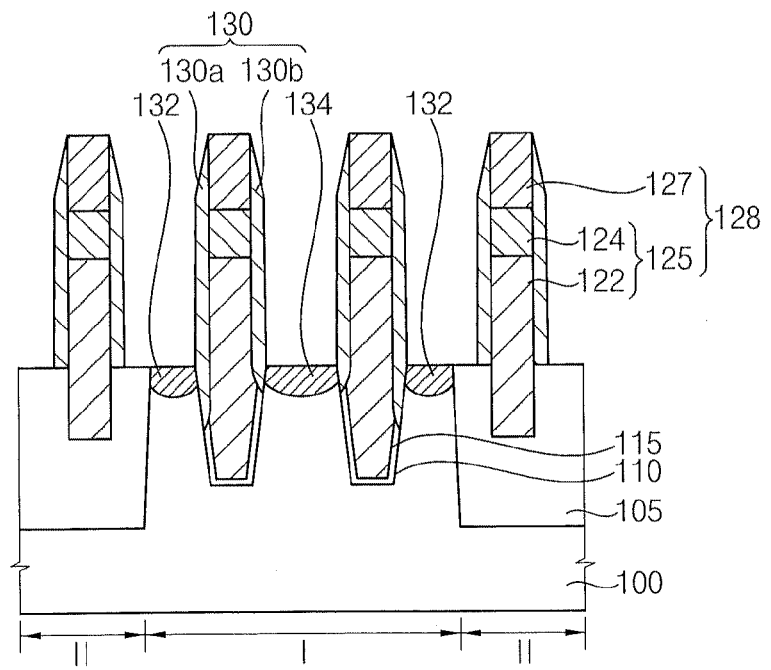

Referring to FIG. 7, a gate spacer 130 may be formed on sidewalls of the gate structure 128. In some embodiments, the gate spacer 130 may be formed by forming a nitride layer on the substrate 100 and the isolation layer 105 to cover the gate structure 128 and the gate trench 110 and performing an anisotropic etching process on the nitride layer until a top surface of the substrate 100 is exposed. The gate spacer 130 may include a first gate spacer 130a and a second gate spacer 130b. In the active region I, the first gate spacer 130a may contact the recess R of the gate structure 128, and may fill the first groove 141, while the second gate spacer 130b may not contact the recess R of the gate structure 128, and may fill the second groove 142. Thus, the first gate spacer 130a may have a vertical length, particularly a vertical length thereof below the top surface of the substrate 100, larger than that of the second spacer 130b.

Impurities may be implanted into the active region I of the substrate 100 using the gate structure 128 and the gate spacer 130 as an ion implantation mask to form the first impurity region 132 and a second impurity region 134 at upper portions of the active region I. The first and second impurity regions 132 and 134 may not contact each other by the gate trench 110. The first and second impurity regions 132 and 134 may serve as source/drain regions. Thus, the recessed channel transistor having the gate structure 128 and the source/drain regions may be formed.

Figure 8:
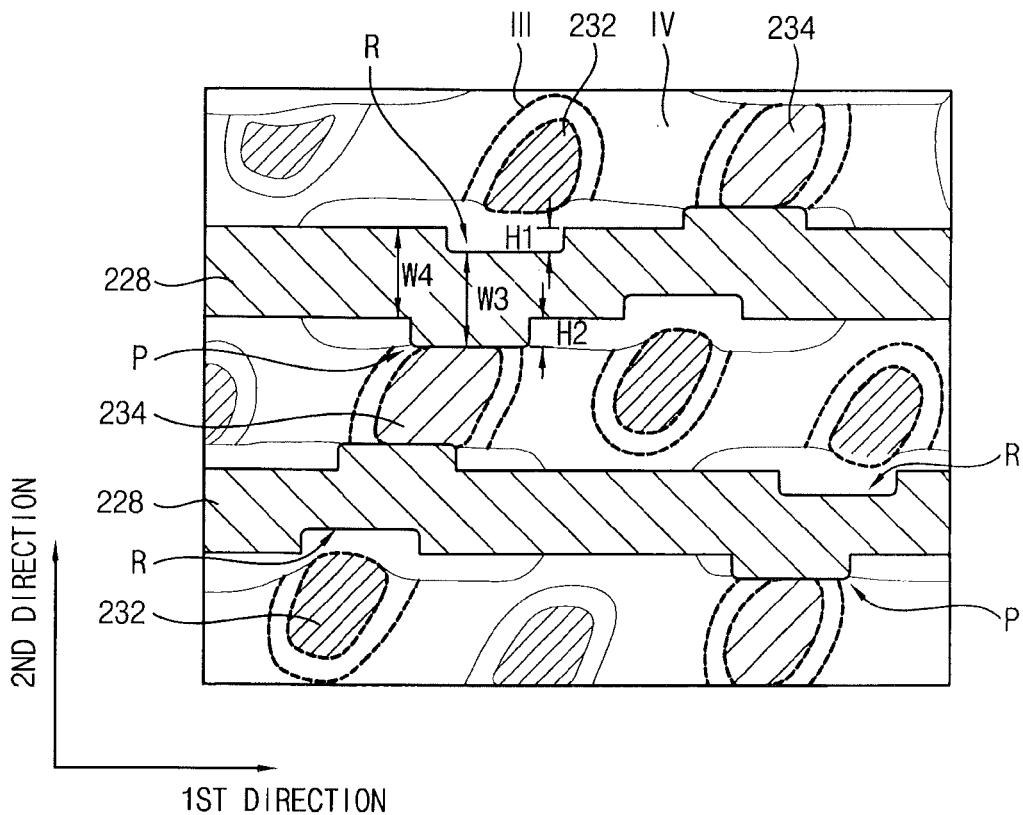
FIG. 8 is a top view illustrating a semiconductor device having a recessed channel transistor in accordance with some embodiments.
Figure 9:
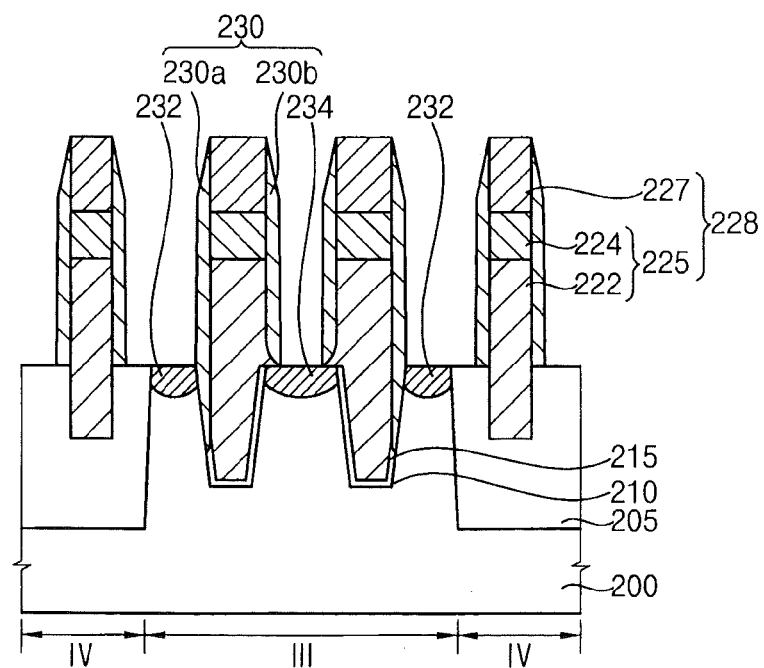
FIG. 9 is a cross-section of the semiconductor device in FIG. 8.

FIG. 8 is a top view illustrating a semiconductor device having a recessed channel transistor in accordance with some embodiments. FIG. 9 is a cross-section of the semiconductor device in FIG. 8. Referring now to FIGS. 8 to 9, the semiconductor device may include an active region III, a gate insulation layer 215, a gate structure 228, a gate spacer 230, a first impurity region 232 and a second impurity region 234.

The active region III of a substrate 200 may be defined by an isolation layer 205 on the substrate 200. That is, a region in which the isolation layer 205 is not formed may be called the active region III, and a region in which the isolation layer 205 is formed may be called a field region IV. In some embodiments, a plurality of active regions III each having an island shape may be formed in the substrate 200. The substrate 200 may include a semiconductor substrate such as a silicon substrate, a germanium substrate, a silicon-germanium substrate, a SOI substrate, a GOI substrate, and the like. The isolation layer 205 may include an oxide such as silicon oxide.

A gate trench 210 may be formed at an upper portion of the active region III of the substrate 200. In some embodiments, the gate trench 210 may extend in a first direction, and thus the gate trench 210 may be also formed at an upper portion of the isolation layer 205. A first portion of the gate trench 210 in the active region III may have a depth larger than that of a second portion of the gate trench 210 in the field region IV. The gate trench 210 may have a planar bottom or a rounded bottom.

The gate insulation layer 215 may be formed on an inner wall, i.e., on a bottom and a sidewall of the gate trench 210. The gate insulation layer 215 may include an oxide such as silicon oxide. In some embodiments, the gate insulation layer 215 may not be formed on the second portion of the gate trench 210, i.e., in the field region IV. In some embodiments, the gate insulation layer 215 may have a uniform thickness on the inner wall of the gate trench 210.

The gate structure 228 may be formed on the gate insulation layer 215 and may fill the gate trench 210. In the field region IV, the gate structure 228 filling the gate trench 210 may not be formed on the gate insulation layer 215 but directly on the inner wall of the gate trench 210. The gate structure 228 may protrude from a top surface of the substrate 200. In some embodiments, the gate structure 228 may have a width smaller than a width of the gate trench 210.

In an example embodiment, the gate structure 228 may have a recess R at a first portion adjacent to the first impurity region 232 and a protrusion P at a second portion adjacent to the second impurity region 234. The gate structure 228 may have a reduced width by a first width difference H1 in a second direction perpendicular to the first direction because of the recess R. The gate structure 228 may have an increased width by a second width difference H2 in the second direction because of the protrusion P. In an example embodiment, the gate structure 228 may have a third width W3 between the first impurity region 232 and the second impurity region 234, which may have both the recess R and the protrusion P. Additionally, the gate structure 228 may have a fourth width W4 in the field region IV, which may have no recess or protrusion. The third width W3 may be substantially equal to or larger than the fourth width W4. At the recess R, the sidewall of the gate trench 210 may be covered neither by the gate insulation layer 215 nor by the gate structure 228. At the protrusion P, the gate structure 228 may partially cover the top surface of the substrate 200.

The gate structure 228 may include a gate electrode 225 and a gate mask 227. The gate electrode 225 may include polysilicon, a metal and/or a metal silicide. In an example embodiment, the gate electrode 225 may include a polysilicon layer pattern 222 and a metal layer pattern 224. The metal layer pattern 224 may include the metal and/or the metal silicide. Alternatively, the gate electrode 225 may include a single layer having polysilicon, the metal or the metal silicide. The gate mask 227 may include a nitride such as silicon nitride.

The gate spacer 230 may be formed on sidewalls of the gate structure 228. In some embodiments, the gate spacer 230 may have a first spacer 230a and a second spacer 230b. The first gate spacer 230a may contact the recess R of the gate structure 228, and the second gate spacer 230b may contact the protrusion P thereof. A lower portion of the first gate spacer 230a may be formed on a portion of the sidewall of the gate trench 210 that is not covered by the gate insulation layer 215 and the gate structure 228, thereby filling a remaining portion of the gate trench 210 in the active region III. Thus, the first gate spacer 230a may have a portion below the top surface of the substrate 200. At the protrusion P, a lower portion of the second gate spacer 230b may not be formed on the sidewall of the gate trench 210, and thus, no portion of the second gate spacer 230b is below the top surface of the substrate 200, because the gate structure 228 may sufficiently fill the gate trench 210. The lower portion of the first gate spacer 230a may increase the electrical distance between the gate electrode 225 and the first impurity region 232, thereby reducing the GIDL of the recessed channel transistor.

The first and second impurity regions 232 and 234 may serve as source/drain regions of the recessed channel transistor. Additionally, the first impurity region 232 may serve as a capacitor contact region electrically connected to a capacitor (not shown) via a capacitor contact plug (not shown), and the second impurity region 234 may serve as a bitline contact region electrically connected to a bitline (not shown) via a bitline contact plug (not shown). The first and second impurity region 232 and 234 may be at upper portions of the active region III adjacent to the gate structure 228. In some embodiments, the first impurity region 232 may be formed adjacent to the recess R of the gate structure 228 and the second impurity region 234 may be formed adjacent to the protrusion P of the gate structure 228. That is, the first impurity region 232 may be closer to the recess R than the second impurity region 234 is. Additionally, the second impurity region 234 may be closer to the protrusion P than the first impurity region 232 is.

The recessed channel transistor in accordance with some embodiments may have a reduced GIDL and a relatively large area of the capacitor contact region because of the recess R. Additionally, the protrusion P may compensate loss of the width of the gate structure 228 generated by the recess R, thereby to improve an electrical conductivity of the gate structure 228.

FIGS. 10 to 13 are cross-sections illustrating a method of manufacturing a semiconductor device having a recessed channel transistor in accordance with some embodiments.

Figure 10:
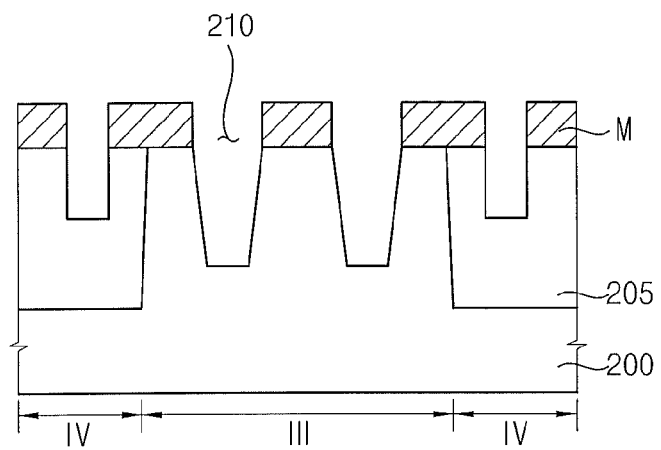
FIGS. 10 to 13 are cross-sections illustrating processing steps in the fabrication of a semiconductor device having a recessed channel transistor in accordance with some embodiments.

Referring to FIG. 10, an isolation layer 205 may be formed on a substrate 200 to define an active region III and a field region IV in the substrate 200. The substrate 200 may include a semiconductor substrate such as a silicon substrate, a germanium substrate, a silicon-germanium substrate, a SOI substrate, a GOI substrate, and the like. The isolation layer 205 may be formed using an oxide such as silicon oxide. In some embodiments, the isolation layer 205 may be formed by a STI process.

A buffer layer (not shown) may be formed on the substrate 200 and the isolation layer 205. The buffer layer may be formed using an oxide such as silicon oxide. The buffer layer may be formed by a CVD process, a SACVD process, an LPCVD process, a PECVD process, and the like.

Impurities may be implanted into the active region III of the substrate 200 by an ion implantation process to form a preliminary impurity region (not shown) in the active region III. A channel of the recessed channel transistor may be controlled by the preliminary impurity region. A mask M may be formed on the substrate 200 and the isolation layer 205. The mask may be formed using a nitride.

Upper portions of the substrate 200 and the isolation layer 205 may be removed using the mask M as an etching mask to form a gate trench 210. Detailed explanations of forming the gate trench 210 are omitted here because those are previously provided with reference to FIG. 4.

Figure 11:
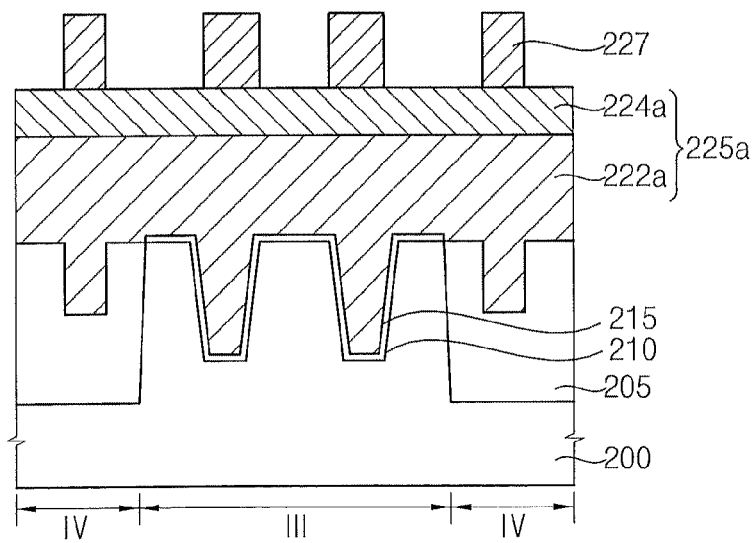

Referring to FIG. 11, a gate insulation layer 215 may be formed on an inner wall of the gate trench 210 and a top surface of the substrate 200 in the active region III. The gate insulation layer 215 may be formed using silicon oxide or a metal oxide such as titanium oxide, zirconium oxide, hafnium oxide, and the like. The gate insulation layer 215 may be formed by a thermal oxidation process, a CVD process, an MOCVD process or an ALD process.

A gate conductive layer 225a may be formed on the gate insulation layer 215 and the isolation layer 204 to fill the gate trench 210. The gate conductive layer 225a may be formed using polysilicon doped with impurities or a metal. The gate conductive layer 225a may be formed by a sputtering process, a CVD process, an LPCVD process, a PECVD process, an ALD process, or a PLD process.

In some embodiments, the gate conductive layer 225a may be formed to have a single layer structure including doped polysilicon. In these embodiments, impurities may be doped into a polysilicon layer (not shown) by an ion implantation process, or a diffusion process. In another example embodiment, the gate conductive layer 225a may be formed to have a multi-layered structure including polysilicon and a metal. That is, the gate conductive layer 225 may be formed to have a polysilicon layer 222a and a metal layer 224a sequentially stacked on the gate insulation layer 215 and the isolation layer 205. The metal layer 224a may be formed using tungsten (W), tungsten alloys, aluminum (Al), aluminum alloys, copper (Cu), and the like. The metal layer 224a may be formed by an ICP process, an IMP process, a sputtering process, or a CVD process. In an example embodiment, a metal silicide layer (not shown) may be further formed between the polysilicon layer 222a and the metal layer 224a.

A gate mask 227 may be formed on the gate conductive layer 225a. The gate mask 227 may be formed by forming a nitride layer on the gate conductive layer 225a and patterning the nitride layer. The nitride layer may be formed by a PECVD process or an LPCVD process. In an example embodiment, the nitride layer may be formed using silane ($SiH_4$) gas and ammonia ($NH_3$) gas. The gate mask 227 may overlap the gate trench 210, and may have a width equal to or smaller than that of the gate trench 210.

Figure 12:
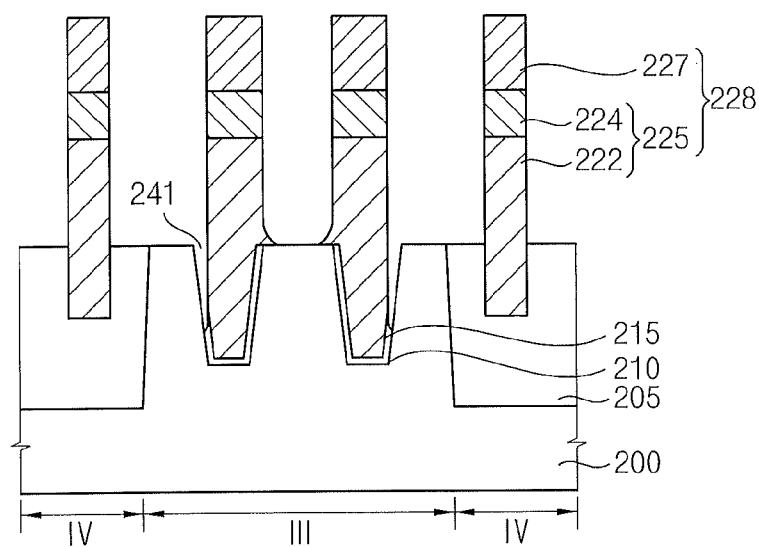

Referring to FIG. 12, the gate conductive layer 225a may be patterned using the gate mask 227 as an etching mask to form a gate electrode 225. In the etching process, a portion of the gate insulation layer 215 beneath the gate conductive layer 225a may be also etched to expose a portion of the sidewall of the gate trench 210. The gate electrode 225 together with the gate mask 227 may be called a gate structure 228. In an example embodiment, the gate electrode 225 may have a polysilicon layer pattern 222 and a metal layer pattern 224 sequentially stacked on the gate insulation layer 215 or the isolation layer 205. The gate structure 228 may fill the gate trench 210. In the field region IV, the gate structure 228 may sufficiently fill the gate trench 210. In the active region III, the gate structure 228 may have a width smaller than that of the gate trench 210, thereby partially filling the gate trench 210.

In some embodiments, the gate structure 228 may have a recess R (see FIG. 8) at a first portion adjacent to a portion of the active region III at which a first impurity region 232 is formed in a subsequent process, and a protrusion P (see FIG. 8) at a second portion adjacent to a portion of the active region III at which a second impurity region 234 is formed in a subsequent process. At the recess R, the gate structure 228 may have a reduced width by a first width difference H1 (see FIG. 8). At the protrusion P, the gate structure 228 may have an increased width by a second width difference H2 (see FIG. 8). In some embodiments, a third width W3 (see FIG. 8) of the gate structure 228 between the first impurity region 232 and the second impurity region 234, which may have both the recess R and the protrusion P, may be substantially equal to or larger than a fourth width W4 (see FIG. 8) of the gate structure 228 in the field region IV, which may have no recess or protrusion.

At the recess R, the sidewall of the gate trench 210 may not be covered by the gate insulation layer 215 or by the gate structure 228 thereon, thereby forming a groove 241 in the gate trench 210 adjacent to the first portion of the gate structure 228. At the protrusion P, the sidewall of the gate trench 210 may not be exposed because the second portion of the gate structure 228 adjacent to the second impurity region 234 may sufficiently fill the gate trench 210.

Figure 13:
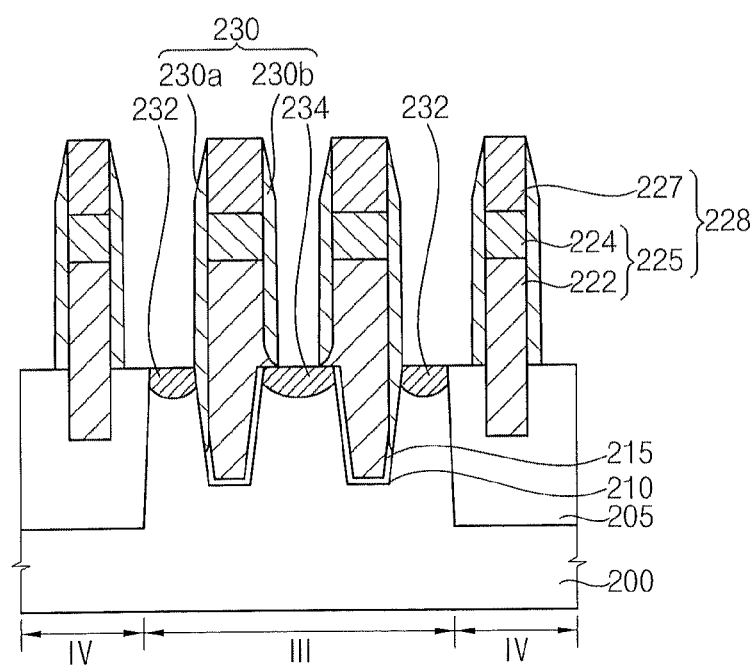

Referring to FIG. 13, a gate spacer 230 may be formed on sidewalls of the gate structure 228. In some embodiments, the gate spacer 230 may be formed by forming a nitride layer on the substrate 200 and the isolation layer 205 to cover the gate structure 228 and the gate trench 210 and performing an anisotropic etching process on the nitride layer until a top surface of the substrate 200 is exposed. The gate spacer 230 may include a first gate spacer 230a and a second gate spacer 230b. In the active region III, the first gate spacer 230a may contact the recess R of the gate structure 228, and may fill the groove 241, while the second gate spacer 230b may contact the protrusion P of the gate structure 228 and may fill no portion of the gate trench 210.

Impurities may be implanted into the active region III of the substrate 200 using the gate structure 228 and the gate spacer 230 as an ion implantation mask to form the first impurity region 232 and the second impurity region 234 at upper portions of the active region III. The first and second impurity regions 232 and 234 may not contact each other by the gate trench 210. The first and second impurity regions 232 and 234 may serve as source/drain regions. Thus, the recessed channel transistor having the gate structure 228 and the source/drain regions may be formed.

Figure 14:
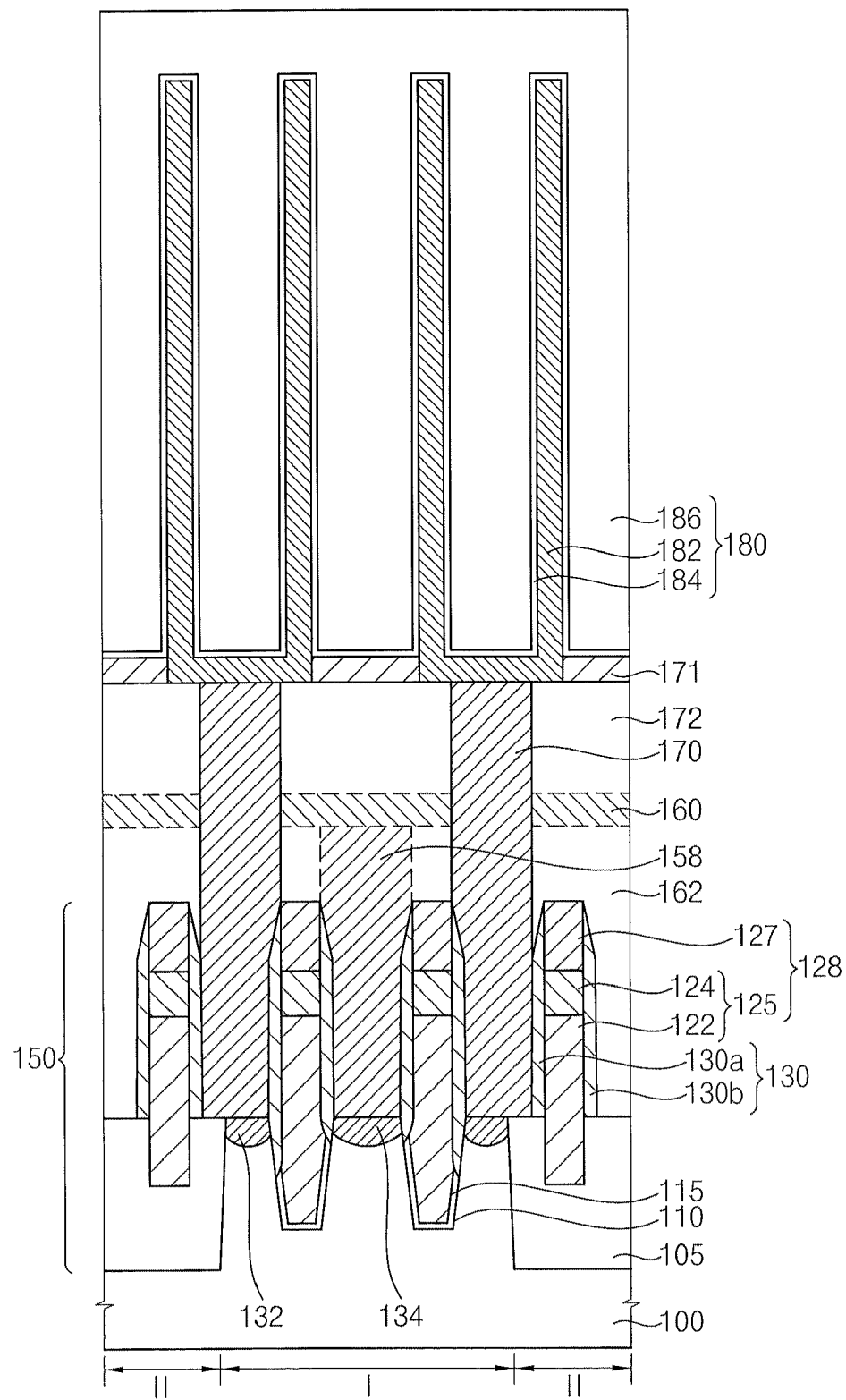
FIG. 14 is a cross-section illustrating a semiconductor device including a recessed channel transistor in accordance with some embodiments.

FIG. 14 is a cross-section illustrating a semiconductor device including a recessed channel transistor in accordance with some embodiments. As illustrated in FIG. 14, the semiconductor device may include a recessed channel transistor 150, a bitline 160 electrically connected to a second impurity region 134 of the transistor 150, and a capacitor 180 electrically connected to a first impurity region 132 of the transistor 150.

The recessed channel transistor 150 may include an active region I in a substrate 100, a gate insulation layer 115, a gate structure 128, a gate spacer 130, the first impurity region 132 and the second impurity region 134, as illustrated in FIGS. 1 to 2. In some embodiments, the gate structure 128 may have a recess R adjacent to the first impurity region 132. Detailed explanations are omitted here because the recessed transistor 150 is substantially the same as that explained with reference to FIGS. 1 to 2. For example, reference numeral 105 indicates the isolation layer, reference numeral 110 indicates the gate trench, and reference numerals 132 and 134 indicate the first and second impurity regions, respectively.

The bitline 160 may be electrically connected to the second impurity region 134 via a bitline contact 158. The bitline contact plug 158 may be formed through a first insulation layer 162. The first insulation layer 162 may electrically insulate the bitline 160 from the gate structure 128. The bitline 160 may include a conductive material, such as doped polysilicon, a metal, a metal silicide, and the like. In some embodiments, the bitline 160 may have a single layer. Alternatively, the bitline 160 may have a multi-layered structure. For example, the bitline 160 may have a multi-layered structure including a titanium/titanium nitride ($Ti/TiN_x$) layer and a tungsten (W) layer.

The capacitor 180 may include a lower electrode 182, a dielectric layer 184 and an upper electrode 186. The capacitor 180 may be electrically connected to the first impurity region 132 via a capacitor contact plug 170. The capacitor contact plug 170 may be formed through the first insulation layer 162 and a second insulation layer 172, which may be formed on the first insulation layer 162 to cover the bitline 160. The second insulation layer 172 may electrically insulate the capacitor 180 from the bitline 160. The lower electrode 182 may be formed on the capacitor contact plug 170 and the second insulation layer 172. The lower electrode 182 may include a conductive material such as doped polysilicon, a metal, a metal silicide, and the like. In some embodiments, the lower electrode 182 may have a single layer. Alternatively, the lower electrode 182 may have a multi-layered structure. For example, the lower electrode 182 may have a multi-layered structure including a titanium layer and a titanium nitride layer. The dielectric layer 184 may be formed on the lower electrode 182 and an etch stop layer 171. The dielectric layer 184 may include a metal oxide having a high dielectric constant, such as aluminum oxide, hafnium oxide, and the like. The upper electrode 186 may be formed on the dielectric layer 184. The upper electrode 186 may include a conductive material such as doped polysilicon, a metal, a metal silicide, and the like. In an example embodiment, the upper electrode 186 may have a single layer. Alternatively, the upper electrode 186 may have a multi-layered structure. For example, the upper electrode 186 may have a multi-layered structure including a polysilicon layer and a metal layer. The semiconductor device in accordance with some embodiments may be used for a dynamic random access memory (DRAM) device.

Figure 15:
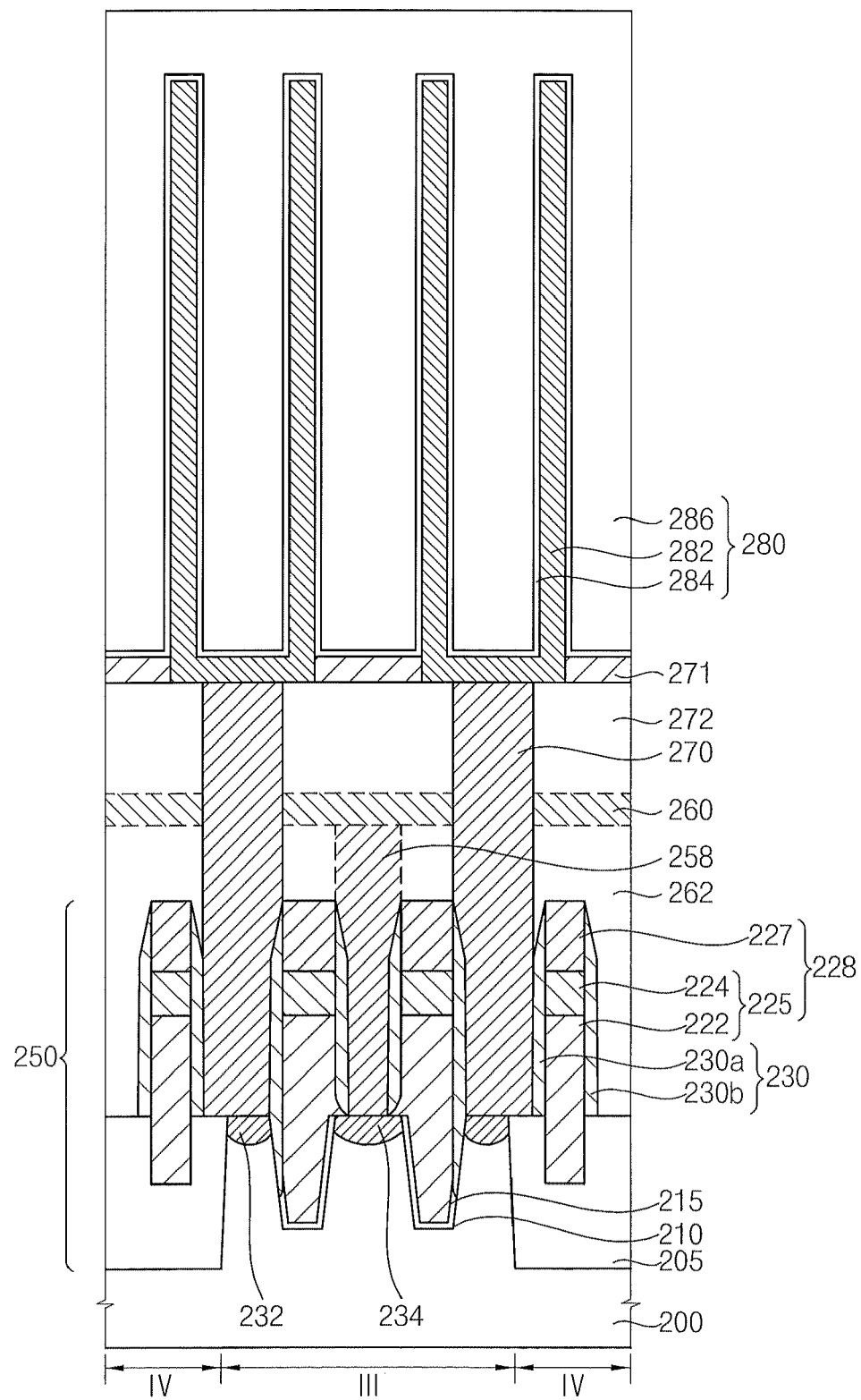
FIG. 15 is a cross-section illustrating a semiconductor device including a recessed channel transistor in accordance with some embodiments.

FIG. 15 is a cross-section illustrating a semiconductor device including a recessed channel transistor in accordance with some embodiments. As illustrated in FIG. 15, the semiconductor device may include a recessed channel transistor 250, a bitline 260 electrically connected to a second impurity region 234 of the transistor 250, and a capacitor 280 electrically connected to a first impurity region 232 of the transistor 250.

The recessed channel transistor 250 may include an active region III in a substrate 200, a gate insulation layer 215, a gate structure 228, a gate spacer 230, the first impurity region 232 and the second impurity region 234, as illustrated in FIGS. 8 to 9. In some embodiments, the gate structure 228 may have a recess R adjacent to the first impurity region 232 and a protrusion P adjacent to the second impurity region 234. Detailed explanations are omitted here because the recessed transistor 250 is substantially the same as that explained with reference to FIGS. 8 to 9. For example, reference numeral 205 indicates the isolation layer, reference numeral 210 indicates the gate trench, and reference numerals 232 and 234 indicate the first and second impurity regions, respectively.

The bitline 260 may be electrically connected to the second impurity region 234 via a bitline contact 258. The bitline contact plug 258 may be formed through a first insulation layer 262. The first insulation layer 262 may electrically insulate the bitline 260 from the gate structure 228. The bitline 260 may include a conductive material such as doped polysilicon, a metal, a metal silicide, and the like. In an example embodiment, the bitline 260 may have a single layer. Alternatively, the bitline 260 may have a multi-layered structure. For example, the bitline 260 may have a multi-layered structure including a titanium/titanium nitride (Ti/TiN$_x$) layer and a tungsten (W) layer.

The capacitor 280 may include a lower electrode 282, a dielectric layer 284 and an upper electrode 286. The capacitor 280 may be electrically connected to the first impurity region 232 via a capacitor contact plug 270. The capacitor contact plug 270 may be formed through the first insulation layer 262 and a second insulation layer 272, which may be formed on the first insulation layer 262 to cover the bitline 260. The second insulation layer 272 may electrically insulate the capacitor 280 from the bitline 260. The lower electrode 282 may be formed on the capacitor contact plug 270 and the second insulation layer 272. The lower electrode 282 may include a conductive material such as doped polysilicon, a metal, a metal silicide, and the like. In an example embodiment, the lower electrode 282 may have a single layer. Alternatively, the lower electrode 282 may have a multi-layered structure. For example, the lower electrode 282 may have a multi-layered structure including a titanium layer and a titanium nitride layer. The dielectric layer 284 may be formed on the lower electrode 282 and an etch stop layer 271. The dielectric layer 284 may include a metal oxide having a high dielectric constant, such as aluminum oxide, hafnium oxide, and the like. The upper electrode 286 may be formed on the dielectric layer 284. The upper electrode 286 may include a conductive material such as doped polysilicon, a metal, a metal silicide, and the like. In an example embodiment, the upper electrode 286 may have a single layer. Alternatively, the upper electrode 286 may have a multi-layered structure. For example, the upper electrode 286 may have a multi-layered structure including a polysilicon layer and a metal layer. The semiconductor device in accordance with some embodiments may be used for a dynamic random access memory (DRAM) device.

Figure 16:
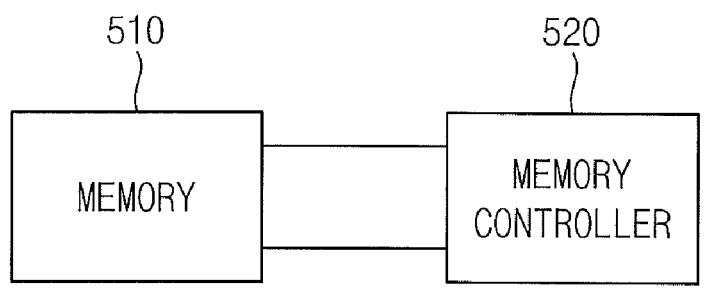
FIG. 16 is a block diagram illustrating a memory card including a recessed channel transistor in accordance with some embodiments.

FIG. 16 is a block diagram illustrating a memory card including a recessed channel transistor in accordance with some embodiments. As illustrated in FIG. 16, the memory card may include a memory controller 520 and a memory 510 connected to the memory controller 520. The memory 510 may be a memory device including the recessed channel transistor according to some embodiments. The memory controller 520 may provide input signals to control operations of the memory 510. In some embodiments, the memory controller provides command (CMD) signals, address (ADD) signals, and input/output signals as the input signals for the memory device. The memory controller 520 may control data of the memory device based on the input signals.

Figure 17:
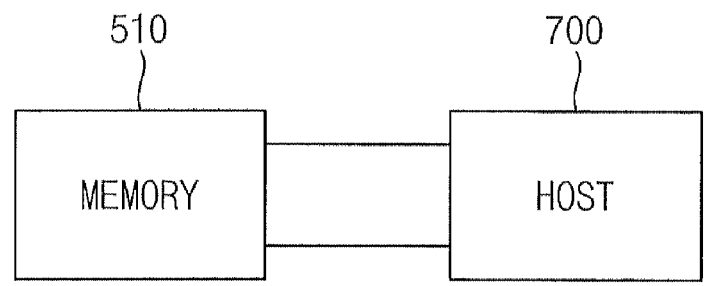
FIG. 17 is a block diagram illustrating an application of a memory device including a recessed channel transistor in accordance with some embodiments.

FIG. 17 is a block diagram illustrating an application of a memory device including a recessed channel transistor in accordance with some embodiments. As illustrated in FIG. 17, a host system 700 is connected to a memory 510. The memory 510 may be a memory device including the recessed channel transistor according to some embodiments.

The host system 700 may include electronics such as a personal computer, a camera, a portable device, a gaming device, a wireless communication device, and the like. The host system 700 may provide input signals to control the memory 510 which may serve as a data storage device.

Figure 18:
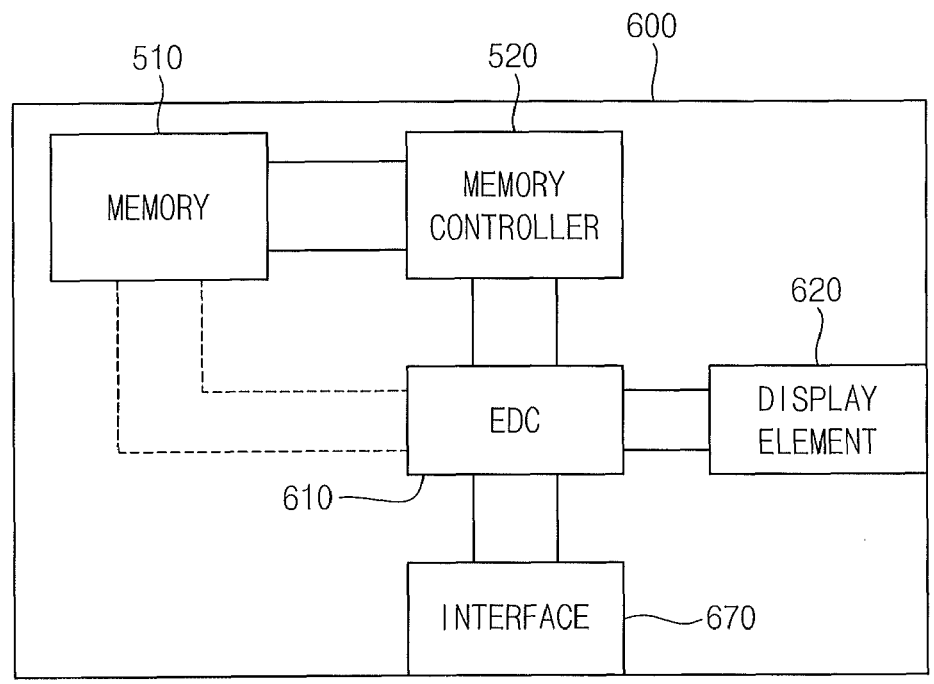
FIG. 18 is a block diagram illustrating a portable device including a recessed channel transistor in accordance with some embodiments.

FIG. 18 is a block diagram illustrating a portable device including a recessed channel transistor in accordance with some embodiments. As illustrated in FIG. 18, a portable device 600 may include an MP3 player, a portable media player (PMP), a handheld game console, and the like. The portable device 600 may include a memory 510 and a memory controller 520.

The memory 510 may be a memory device including the recessed channel transistor according to some embodiments. The portable device 600 may include an encoder/decoder (EDC) 610, a display element 620, and an interface 670. Audio or video data may be directly input from the EDC 610 to the memory 510, or directly output from the memory 510 to the EDC 610.

Figure 19:
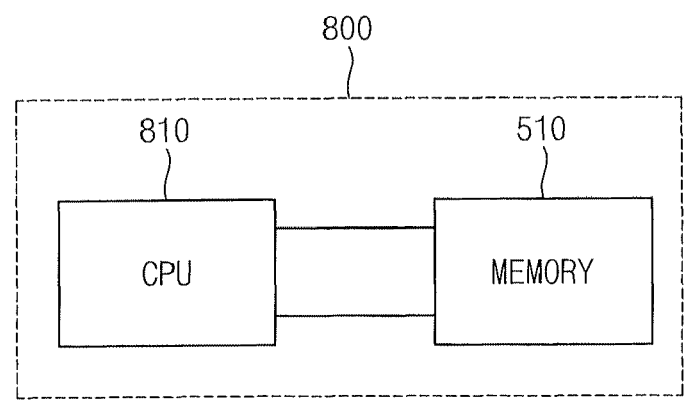
FIG. 19 is a block diagram illustrating a computer including a recessed channel transistor in accordance with some embodiments.

FIG. 19 is a block diagram illustrating a computer including a recessed channel transistor in accordance with some embodiments. As illustrated in FIG. 19, a computer 800 may include a memory 510 and a central processing unit (CPU) 810 connected to the memory 510. In an example embodiment, the computer system may be a desktop computer, a laptop computer, or a personal digital assistant (PDA).

The memory 510 may be directly connected to the CPU 810, or indirectly connected to the CPU 810 via buses. The memory 510 may be a memory device including a recessed channel transistor according to some embodiments.

Example embodiments are described above with reference to block diagrams and/or flowchart illustrations of systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), and a portable compact disc read-only memory (CD-ROM).

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a programmed digital signal processor or microcontroller.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a semiconductor device, comprising:

forming an isolation layer on a substrate, the isolation layer defining an active region;

forming a gate trench at an upper portion of the active region of the substrate;

forming a gate insulation layer on an inner wall of the gate trench;

forming a gate structure on the gate insulation layer to fill the gate trench, the gate structure having a width smaller than a width of the gate trench and having a recess at a first portion thereof;

forming a gate spacer on sidewalls of the gate structure; and implanting impurities into upper portions of the active region to form first and second impurity regions adjacent to the gate structure, the first impurity region being closer to the recess than the second impurity region, wherein the gate trench is formed to have a reduced width near the recess in a second direction perpendicular to the first direction.

2. The method of claim 1, wherein forming the gate spacer comprises forming first and second spacers, the first spacer contacting the recess.

3. The method of claim 2, wherein the first spacer has a larger height than a height of the second spacer.

4. The method of claim 1, wherein the gate trench is formed to extend in a first direction and be further formed on the isolation layer.

5. The method of claim 1, wherein forming the gate structure includes forming the gate structure to have a protrusion at a second portion thereof, the second impurity region being closer to the protrusion than the first impurity region.

6. The method of claim 5, wherein forming the gate spacer includes forming first and second spacers, the first spacer contacting the recess, and the second spacer contacting the protrusion.

7. The method of claim 1, further comprising forming a capacitor electrically connected to the first impurity region.

* * * * *